United States Patent
Wang et al.

(10) Patent No.: US 7,571,698 B2
(45) Date of Patent: Aug. 11, 2009

(54) LOW-FREQUENCY BIAS POWER IN HDP-CVD PROCESSES

(75) Inventors: Rongping Wang, Cupertino, CA (US); Canfeng Lai, Fremont, CA (US); Yuri Trachuk, San Jose, CA (US); Siamak Salimian, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 838 days.

(21) Appl. No.: 11/034,515

(22) Filed: Jan. 10, 2005

(65) Prior Publication Data

US 2006/0150913 A1 Jul. 13, 2006

(51) Int. Cl.
*C23C 16/00* (2006.01)
*C23C 14/00* (2006.01)

(52) U.S. Cl. ............... 118/723 R; 118/728; 118/723 E; 204/298.06; 204/298.03; 204/298.15; 427/8

(58) Field of Classification Search ............ 204/298.06, 204/298.08, 298.15; 118/715, 723 R, 723 E; 427/8

See application file for complete search history.

(56) References Cited

U.S. PATENT DOCUMENTS

| | | | |
|---|---|---|---|
| 5,729,145 A * | 3/1998 | Blades ........................ | 324/536 |
| 6,013,584 A | 1/2000 | M'Saad et al. | |
| 6,077,357 A * | 6/2000 | Rossman et al. ............ | 118/728 |
| 6,328,845 B1 | 12/2001 | Ohmoto et al. | |
| 2003/0213434 A1* | 11/2003 | Gondhalekar et al. ....... | 118/724 |
| 2004/0011467 A1* | 1/2004 | Hemker et al. .......... | 156/345.49 |
| 2004/0259367 A1 | 12/2004 | Constantine et al. | |
| 2004/0266175 A1 | 12/2004 | Chen et al. | |

FOREIGN PATENT DOCUMENTS

| EP | 0 822 585 A2 | 2/1998 |
|---|---|---|
| EP | 1 158 071 A2 | 11/2001 |

OTHER PUBLICATIONS

Abraham, I.C. et al. "Ion energy distributions versus frequency and ion mass at the rf-biased electrode in an inductively driven discharge" J. Vac. Sci. Technol. A, Sep./Oct. 2002, pp. 1759-1768, vol. 20, No. 5.

* cited by examiner

*Primary Examiner*—Nam X Nguyen
*Assistant Examiner*—John Brayton
(74) *Attorney, Agent, or Firm*—Townsend and Townsend and Crew

(57) ABSTRACT

A substrate processing system has a housing that defines a process chamber. A substrate holder disposed within the process chamber supports a substrate during substrate processing. A gas-delivery system introduces a gas into the process chamber. A pressure-control system maintains a selected pressure within the process chamber. A high-density plasma generating system forms a plasma having a density greater than $10^{11}$ ions/cm$^3$ within the process chamber. A radio-frequency bias system generates an electrical bias on the substrate at a frequency less than 5 MHz. A controller controls the gas-delivery system, the pressure-control system, the high-density plasma generating system, and the radio-frequency bias system.

14 Claims, 6 Drawing Sheets

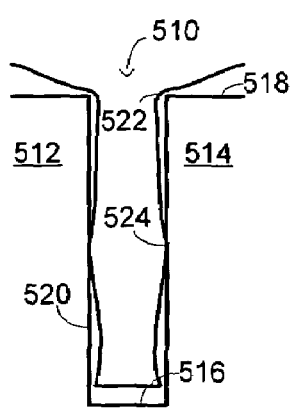 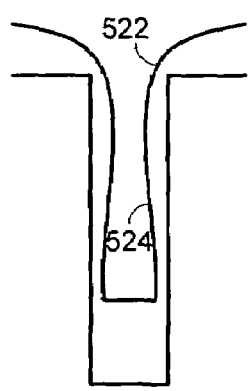 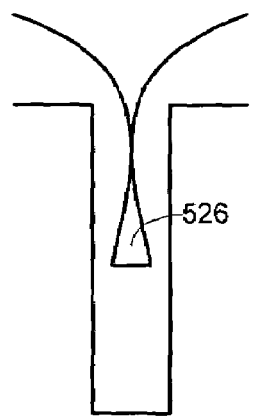
Fig. 5A  Fig. 5B  Fig. 5C
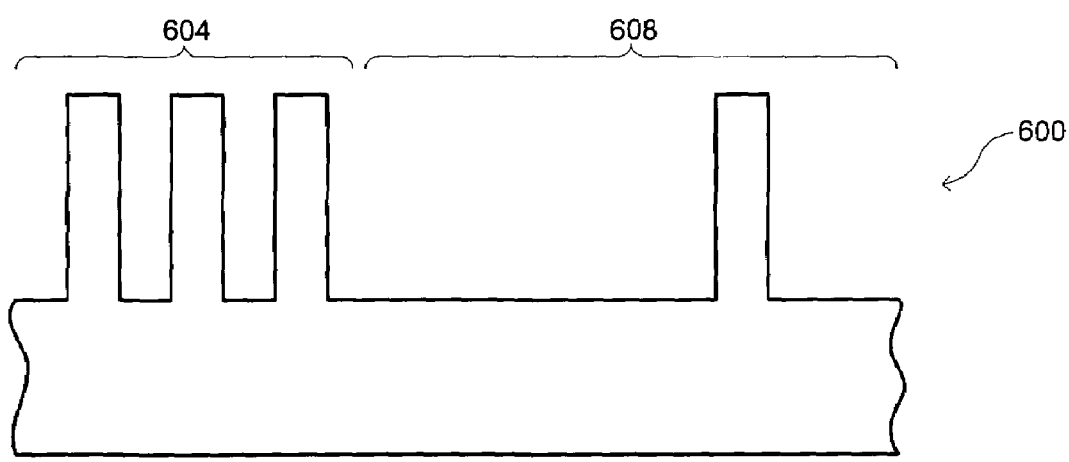
Fig. 6

LOW-FREQUENCY BIAS POWER IN HDP-CVD PROCESSES

BACKGROUND OF THE INVENTION

One of the primary steps in the fabrication of modern semiconductor devices is the formation of a film, such as a silicon oxide film, on a semiconductor substrate. Silicon oxide is widely used as an insulating layer in the manufacture of semiconductor devices. As is well known, a silicon oxide film can be deposited by a thermal chemical-vapor deposition ("CVD") process or by a plasma-enhanced chemical-vapor deposition ("PECVD") process. In a conventional thermal CVD process, reactive gases are supplied to a surface of the substrate, where heat-induced chemical reactions take place to produce a desired film. In a conventional plasma-deposition process, a controlled plasma is formed to decompose and/or energize reactive species to produce the desired film.

Semiconductor device geometries have decreased significantly in size since such devices were first introduced several decades ago, and continue to be reduced in size. This continuing reduction in the scale of device geometry has resulted in a dramatic increase in the density of circuit elements and interconnections formed in integrated circuits fabricated on a semiconductor substrate. One persistent challenge faced by semiconductor manufacturers in the design and fabrication of such densely packed integrated circuits is the desire to prevent spurious interactions between circuit elements, a goal that has required ongoing innovation as geometry scales continue to decrease.

Unwanted interactions are typically prevented by providing spaces between adjacent elements that are filled with an electrically insulative material to isolate the elements both physically and electrically. Such spaces are sometimes referred to herein as "gaps" or "trenches," and the processes for filling such spaces are commonly referred to in the art as "gapfill" processes. The ability of a given process to produce a film that completely fills such gaps is thus often referred to as the "gapfill ability" of the process, with the film described as a "gapfill layer" or "gapfill film." As circuit densities increase with smaller feature sizes, the widths of these gaps decrease, resulting in an increase in their aspect ratio, which is defined by the ratio of the gap's height to its depth. High-aspect-ratio gaps are difficult to fill completely using conventional CVD techniques, which tend to have relatively poor gapfill abilities. One family of electrically insulating films that is commonly used to fill gaps in intermetal dielectric ("IMD") applications, premetal dielectric ("PMD") applications, and shallow-trench-isolation ("STI") applications, among others, is silicon oxide (sometimes also referred to as "silica glass" or "silicate glass").

Some integrated circuit manufacturers have turned to the use of high-density plasma CVD ("HDP-CVD") systems in depositing silicon oxide gapfill layers. Such systems form a plasma that has a density greater than about $10^{11}$ ions/cm$^3$, which is about two orders of magnitude greater than the plasma density provided by a standard capacitively coupled plasma CVD system. One factor that allows films deposited by such HDP-CVD techniques to have improved gapfill characteristics is the occurrence of sputtering simultaneous with deposition of material. Sputtering is a mechanical process by which material is ejected by impact, and is promoted by the high ionic density of the plasma in HDP-CVD processes. The sputtering component of HDP deposition thus slows deposition on certain features, such as the corners of raised surfaces, thereby contributing to the increased gapfill ability.

Biasing of the substrate may attract the charged ionic species in the plasma, resulting in an interaction anisotropy that promotes bottom-up gapfill. One drawback to biasing the substrate is that an electrical discharge may result, causing arcing within the chamber. Even when such discharges are relatively small, they may result in microcontamination of the substrate and produce defects. Such discharge is typically avoided by setting lower limits on chamber pressure and/or upper limits on the bias power. Such limits act to constrain the way in which substrates may be processed. Although lower chamber pressures and higher bias powers may be useful in achieving desired film characteristics, such as substantially void-free gapfill for certain aggressive structures, they both tend to increase the occurrence of undesirable bias discharge.

There is accordingly a need in the art for improved systems that reduce the tendency for bias application to cause electrical discharges in HDP systems.

BRIEF SUMMARY OF THE INVENTION

Embodiments of the invention reduce the risk of bias discharge by using a lower frequency for the bias and additionally enhance tuning speed for the bias system with electronic frequency sweeping. In a first set of embodiments, a substrate processing system is provided. A housing defines a process chamber. A substrate holder is disposed within the process chamber and configured to support a substrate during substrate processing. A gas-delivery system is configured to introduce a gas into the process chamber. A pressure-control system maintains a selected pressure within the process chamber. A high-density plasma generating system is operatively coupled with the process chamber for forming a plasma having a density greater than $10^{11}$ ions/cm$^3$ within the process chamber. A radio-frequency bias system is electrically coupled with the substrate holder to generate an electrical bias on the substrate at a frequency less than 5 MHz. A controller controls the gas-delivery system, the pressure-control system, the high-density plasma generating system, and the radio-frequency bias system.

In some instances, frequency of the electrical bias may be less than 3 MHz. The pressure-control system may maintain the selected pressure less than 2 mtorr or less than 1 mtorr in different embodiments. The radio-frequency bias system may generate a bias having a power greater than 5000 W. In one embodiment, the radio-frequency bias system comprises a radio-frequency generator electrically coupled with an impedance matching network. The radio-frequency generator is adapted to electronically sweep cyclically through a frequency range to determine the frequency that minimizes a power reflected from the process chamber. The radio-frequency generator may also be adapted to change the frequency in response to a change in the power reflected from the process chamber. The radio-frequency generator may be adapted to electronically sweep with a period substantially between 50 and 100 ms. The frequency range may be approximately 2.7-3.3 MHz in one embodiment.

In a second set of embodiments, a substrate processing system is also provided. A housing defines a process chamber. A substrate holder is disposed within the process chamber and configured to support a substrate during substrate processing. A gas-delivery system is configured to introduce a gas into the process chamber. A pressure-control system maintains a selected pressure within the process chamber. A high-density plasma generating system is operatively coupled with the process chamber for forming a plasma having a density greater than $10^{11}$ ions/cm$^3$ within the process chamber. A radio-frequency bias system is electrically coupled with the substrate holder and comprises a radio-frequency generator electrically coupled with an impedance matching network. The radio-frequency generator is adapted to electronically sweep cyclically through a frequency range to determine a frequency that minimizes a power reflected from the process chamber. A controller controls the gas-delivery system, the pressure-control system, the high-density plasma generating system, and the radio-frequency bias system. In various specific embodiments, the pressure, bias power, frequency range, sweeping period, and the like may be as noted above.

In a third set of embodiments, a method is provided for depositing a silicon oxide film on a substrate disposed in a substrate processing chamber. A process gas is flowed into the substrate processing chamber. The process gas comprises a silicon source, an oxygen source, and a fluent gas. A plasma having an ion density greater than $10^{11}$ ions/cm$^3$ is formed from the process gas. An electrical bias is applied to the substrate at a frequency less than 5 MHz. The silicon oxide film is deposited over the substrate with the plasma in a process that has simultaneous deposition and sputtering components. In some instances, the substrate may have a gap formed between adjacent raised surfaces, with the film also being deposited within the gap. In various specific embodiments, the pressure, bias power, frequency range and sweeping period of a sweeping frequency, and the like may be as noted above.

In a fourth set of embodiments, a method is provided for depositing a silicon oxide film on a substrate disposed in a substrate processing chamber. A process gas is flowed into the substrate processing chamber. The process gas comprises a silicon source, an oxygen source, and a fluent gas. A plasma having an ion density greater than $10^{11}$ ions/cm$^3$ is formed from the process gas. An electrical bias is applied to the substrate. The electrical bias is swept through a frequency range to determine a frequency that minimizes a power reflected from the substrate processing chamber. The silicon oxide film is deposited over the substrate with the plasma in a process that has simultaneous deposition and sputtering components. In some instances, the substrate may have a gap formed between adjacent raised surfaces, with the film also being deposited within the gap. In various specific embodiments, the pressure, bias power, frequency range, sweeping period, and the like may be as noted above.

A further understanding of the nature and advantages of the present invention ay be realized by reference to the remaining portions of the specification and the drawings.

BRIEF DESCRIPTION OF THE DRAWINGS

FIGS. 5A-5C are simplified cross-sectional views that illustrate the risk of void formation during deposition of a gapfill film; and FIG. 6 is a simplified cross-sectional view of a partially completed integrated circuit having trenches to be filled with a dielectric material in both a densely packed area and an open area.

DETAILED DESCRIPTION OF THE INVENTION

The inventors have recognized that the risk of bias discharge during HDP-CVD processes may be reduced by operating an rf bias generator at lower frequencies. Current HDP-CVD systems typically operate rf bias generators at a frequency of about 13.56 MHz, a value that has been chosen primarily to avoid frequency bands that are commonly used for commercial and military applications. Besides changing ion energy and angle distributions in the plasma, the reduction of bias frequency is also believed to influence coupling RF power with ions in plasma such that lower chamber pressures and higher biases may be used. In particular, the response capability of ionic species is limited so that individual ions do not respond to the bias field as effectively when the field changes rapidly. When higher frequencies are used, the power coupling with the ions is thus relatively inefficient, leading to heating of the plasma. The combination of the high density of the plasma with an elevated plasma potential produces an avalanche effect that provides many potential arcing path and an increased likelihood of bias-induced discharge. Conversely, when a lower frequency is used that is more consistent with the response capability of the ions, the power coupling with the plasma is more efficient, causing less temperature change but increases impingement of ions on the substrate surface. With this more efficient process, the bias-induced discharge probability is reduced, even for similar plasma density and bias-power characteristics.

Figure 1A:
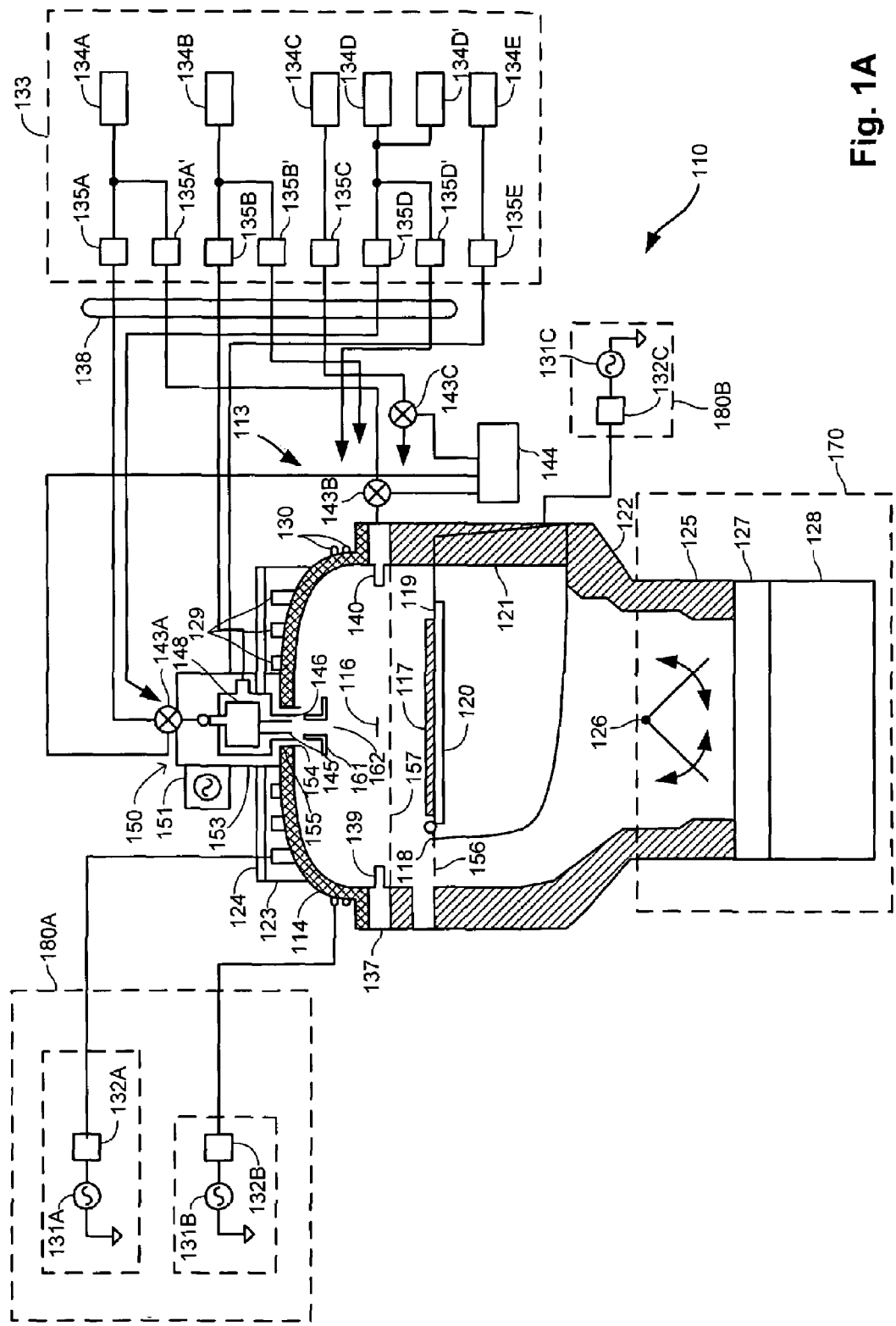
FIG. 1A is a simplified diagram of one embodiment of an HDP-CVD system according to the present invention.

The inventors have implemented embodiments of the invention with the ULTIMA™ system manufactured by APPLIED MATERIALS, INC., of Santa Clara, Calif., a general description of which is provided in commonly assigned U.S. Pat. No. 6,170,428, "SYMMETRIC TUNABLE INDUCTIVELY COUPLED HDP-CVD REACTOR," filed Jul. 15, 1996 by Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha, the entire disclosure of which is incorporated herein by reference. An overview of the ICP reactor is provided in connection with FIGS. 1A and 1B below. FIG. 1A schematically illustrates the structure of such an HDP-CVD system 110 in one embodiment. The system 110 includes a chamber 113, a vacuum system 170, a source plasma system 180A, a bias plasma system 180B, a gas delivery system 133, and a remote plasma cleaning system 150.

The upper portion of chamber 113 includes a dome 114, which is made of a ceramic dielectric material, such as aluminum oxide or aluminum nitride. Dome 114 defines an upper boundary of a plasma processing region 116. Plasma processing region 116 is bounded on the bottom by the upper surface of a substrate 117 and a substrate support member 118.

A heater plate 123 and a cold plate 124 surmount, and are thermally coupled to, dome 114. Heater plate 123 and cold plate 124 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 113 includes a body member 122, which joins the chamber to the vacuum system. A base portion 121 of substrate support member 118 is mounted on, and forms a continuous inner surface with, body member 122. Substrates are transferred into and out of chamber 113 by a robot blade (not shown) through an insertion/removal opening (not shown) in the side of chamber 113. Lift pins (not shown) are raised and then lowered under the control of a motor (also not shown) to move the substrate from the robot blade at an upper loading position 157 to a lower processing position 156 in which the substrate is placed on a substrate receiving portion 119 of substrate support member 118. Substrate receiving portion 119 includes an electrostatic chuck 120 that secures the substrate to substrate support member 118 during substrate processing. In a preferred embodiment, substrate support member 118 is made from an aluminum oxide or aluminum ceramic material.

Vacuum system 170 includes throttle body 125, which houses twin-blade throttle valve 126 and is attached to gate valve 127 and turbo-molecular pump 128. It should be noted that throttle body 125 offers minimum obstruction to gas flow, and allows symmetric pumping. Gate valve 127 can isolate pump 128 from throttle body 125, and can also control chamber pressure by restricting the exhaust flow capacity when throttle valve 126 is fully open. The arrangement of the throttle valve, gate valve, and turbo-molecular pump allow accurate and stable control of chamber pressures up to about 1 millitorr to about 2 torr.

The source plasma system 180A includes a top coil 129 and side coil 130, mounted on dome 114. A symmetrical ground shield (not shown) reduces electrical coupling between the coils. Top coil 129 is powered by top source RF (SRF) generator 131A, whereas side coil 130 is powered by side SRF generator 131B, allowing independent power levels and frequencies of operation for each coil. This dual coil system allows control of the radial ion density in chamber 113, thereby improving plasma uniformity. Side coil 130 and top coil 129 are typically inductively driven, which does not require a complimentary electrode. In a specific embodiment, the top source RF generator 131A provides up to 10,000 watts of RF power at nominally 2 MHz and the side source RF generator 131B provides up to 10,000 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 180B includes a bias RF ("BRF") generator 131C and a bias matching network 132C. The bias plasma system 180B capacitively couples substrate portion 117 to body member 122, which act as complimentary electrodes. The bias plasma system 180B serves to enhance the transport of plasma species (e.g., ions) created by the source plasma system 180A to the surface of the substrate. In a specific embodiment, bias RF generator provides up to 10,000 watts of RF power at a frequency less than 5 MHz, as discussed further below.

RF generators 131A and 131B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator.

Matching networks 132A and 132B match the output impedance of generators 131A and 131B with their respective coils 129 and 130. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 1B:
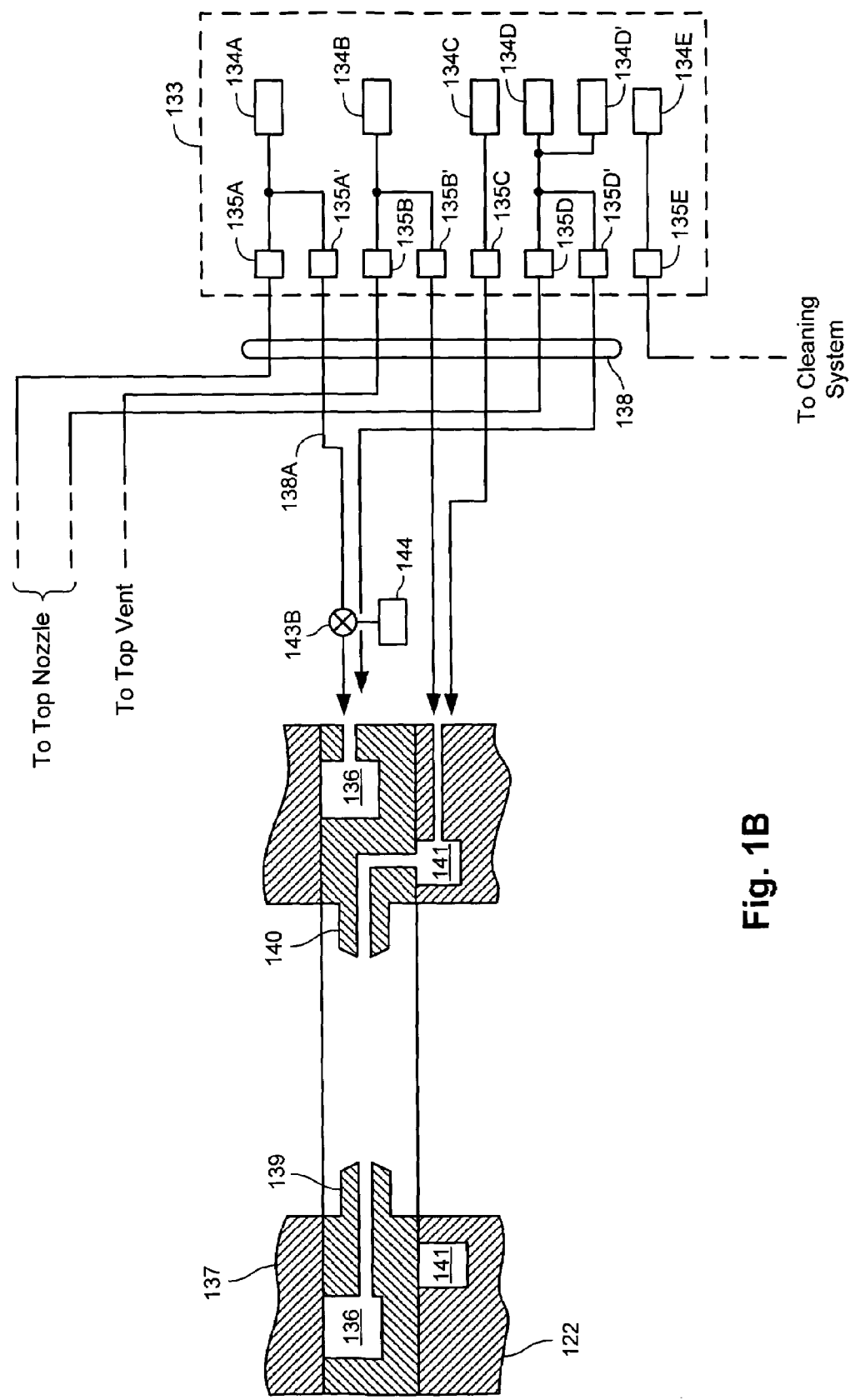
FIG. 1B is a simplified cross section of a gas ring that may be used in conjunction with the exemplary HDP-CVD processing chamber of FIG. 1A.

A gas delivery system 133 provides gases from several sources, 134A-134E chamber for processing the substrate via gas delivery lines 138 (only some of which are shown). As would be understood by a person of skill in the art, the actual sources used for sources 134A-134E and the actual connection of delivery lines 138 to chamber 113 varies depending on the deposition and cleaning processes executed within chamber 113. Gases are introduced into chamber 113 through a gas ring 137 and/or a top nozzle 145. FIG. 1B is a simplified, partial cross-sectional view of chamber 113 showing additional details of gas ring 137.

In one embodiment, first and second gas sources, 134A and 134B, and first and second gas flow controllers, 135A' and 135B', provide gas to ring plenum 136 in gas ring 137 via gas delivery lines 138 (only some of which are shown). Gas ring 137 has a plurality of source gas nozzles 139 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 137 has 12 source gas nozzles made from an aluminum oxide ceramic.

Gas ring 137 also has a plurality of oxidizer gas nozzles 140 (only one of which is shown), which in a preferred embodiment are co-planar with and shorter than source gas nozzles 139, and in one embodiment receive gas from body plenum 141. In some embodiments it is desirable not to mix source gases and oxidizer gases before injecting the gases into chamber 113. In other embodiments, oxidizer gas and source gas may be mixed prior to injecting the gases into chamber 113 by providing apertures (not shown) between body plenum 141 and gas ring plenum 136. In one embodiment, third, fourth, and fifth gas sources, 134C, 134D, and 134D', and third and fourth gas flow controllers, 135C and 135D', provide gas to body plenum via gas delivery lines 138. Additional valves, such as 143B (other valves not shown), may shut off gas from the flow controllers to the chamber. In implementing certain embodiments of the invention, source 134A comprises a silane $SiH_4$ source, source 134B comprises a molecular oxygen $O_2$ source, source 134C comprises a silane $SiH_4$ source, source 134D comprises a helium He source, and source 134D' comprises a molecular hydrogen $H_2$ source.

In embodiments where flammable, toxic, or corrosive gases are used, it may be desirable to eliminate gas remaining in the gas delivery lines after a deposition. This may be accomplished using a 3-way valve, such as valve 143B, to isolate chamber 113 from delivery line 138A and to vent delivery line 138A to vacuum foreline 144, for example. As shown in FIG. 1A, other similar valves, such as 143A and 143C, may be incorporated on other gas delivery lines. Such three-way valves may be placed as close to chamber 113 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 1A, chamber 113 also has top nozzle 145 and top vent 146. Top nozzle 145 and top vent 146 allow independent control of top and side flows of the gases, which improves film uniformity and allows fine adjustment of the film's deposition and doping parameters. Top vent 146 is an annular opening around top nozzle 145. In one embodiment, first gas source 134A supplies source gas nozzles 139 and top nozzle 145. Source nozzle MFC 135A' controls the amount of gas delivered to source gas nozzles 139 and top nozzle MFC 135A controls the amount of gas delivered to top gas nozzle 145. Similarly, two MFCs 135B and 135B' may be used to control the flow of oxygen to both top vent 146 and oxidizer gas nozzles 140 from a single source of oxygen, such as source 134B. In some embodiments, oxygen is not supplied to the chamber from any side nozzles. The gases supplied to top nozzle 145 and top vent 146 may be kept separate prior to flowing the gases into chamber 113, or the gases may be mixed in top plenum 148 before they flow into chamber 113. Separate sources of the same gas may be used to supply various portions of the chamber.

A remote microwave-generated plasma cleaning system 150 is provided to periodically clean deposition residues from chamber components. The cleaning system includes a remote microwave generator 151 that creates a plasma from a cleaning gas source 134E (e.g., molecular fluorine, nitrogen trifluoride, other fluorocarbons or equivalents) in reactor cavity 153. The reactive species resulting from this plasma are conveyed to chamber 113 through cleaning gas feed port 154 via applicator tube 155. The materials used to contain the cleaning plasma (e.g., cavity 153 and applicator tube 155) must be resistant to attack by the plasma. The distance between reactor cavity 153 and feed port 154 should be kept as short as practical, since the concentration of desirable plasma species may decline with distance from reactor cavity 153. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 120, do not need to be covered with a dummy wafer or otherwise protected, as may be required with an in situ plasma cleaning process. In FIG. 1A, the plasma-cleaning system 150 is shown disposed above the chamber 113, although other positions may alternatively be used.

A baffle 161 may be provided proximate the top nozzle to direct flows of source gases supplied through the top nozzle into the chamber and to direct flows of remotely generated plasma. Source gases provided through top nozzle 145 are directed through a central passage 162 into the chamber, while remotely generated plasma species provided through the cleaning gas feed port 154 are directed to the sides of the chamber 113 by the baffle 161.

Figure 2:
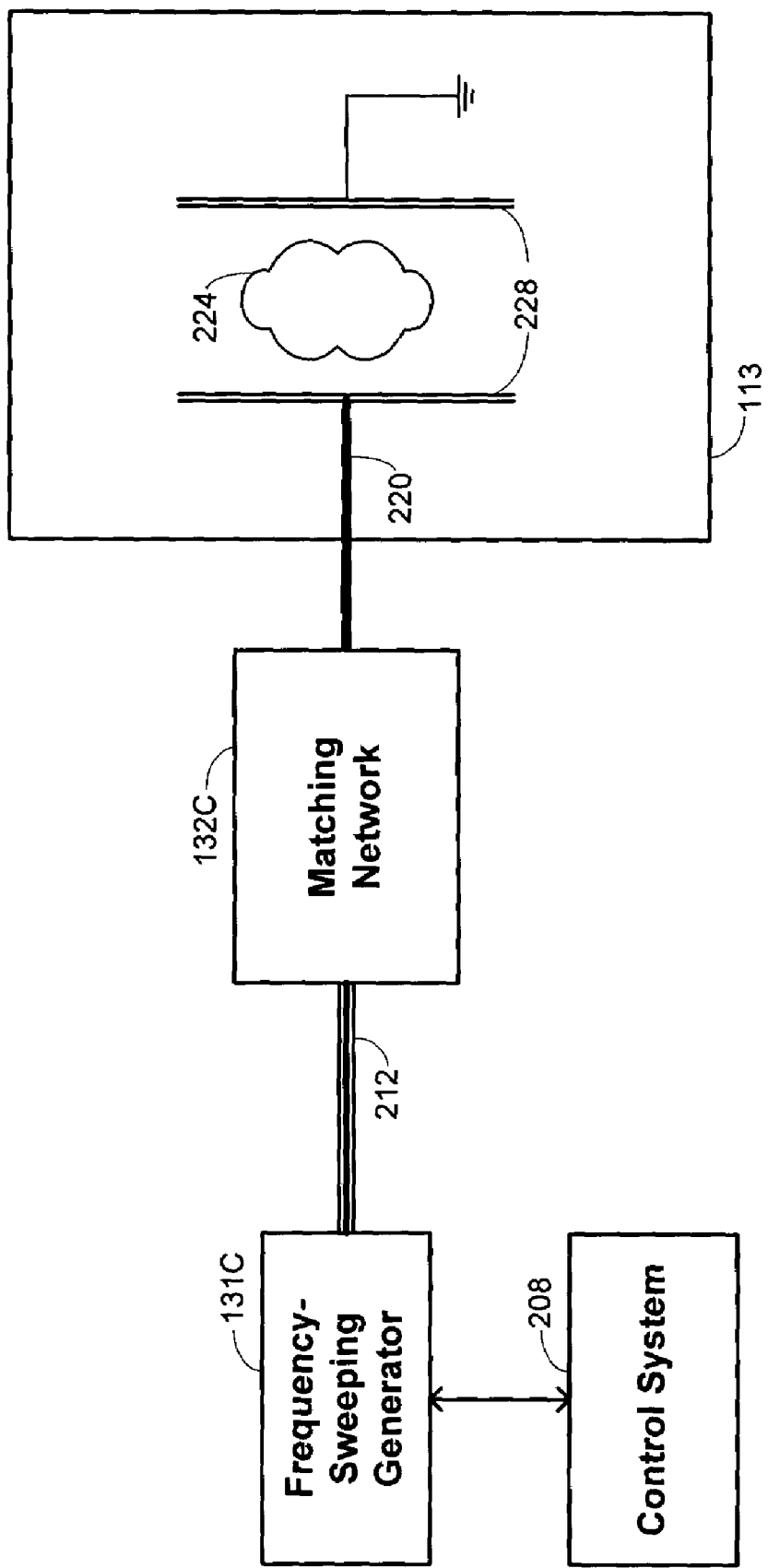
FIG. 2 is a schematic illustration of a bias-generation system that may be used with the HDP-CVD system of FIGS. 1A and 1B in an embodiment of the invention.

FIG. 2 provides a schematic illustration of the bias-generation system in an embodiment of the invention. In this illustration, a plasma 224 within the chamber 113 is subjected to a bias, with capacitive coupling plates for the bias system denoted generically as elements 228. As previously noted, the substrate 117 and body member 122 may act as complementary electrodes corresponding to the capacitive coupling plates 228. An rf feeding rod 220 provides electrical communication between the capacitive coupling plates 228 and the matching network 132C, which is configured to match the output impedance of the bias rf generator 131C. The bias rf generator 131C and matching network 132C are provided in electrical communication with a transmission line 212. A control system 208 is provided to tune the matching network 132C when in accordance with power levels reflected back from the load.

Figure 3A:
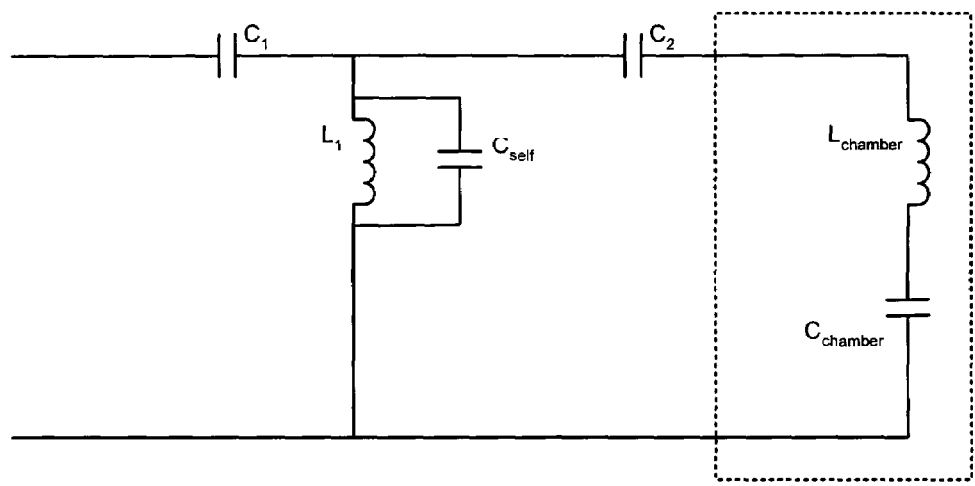
FIGS. 3A and 3B provide exemplary matching networks that may be used with the bias-generation system shown in FIG. 2.
Figure 3B:
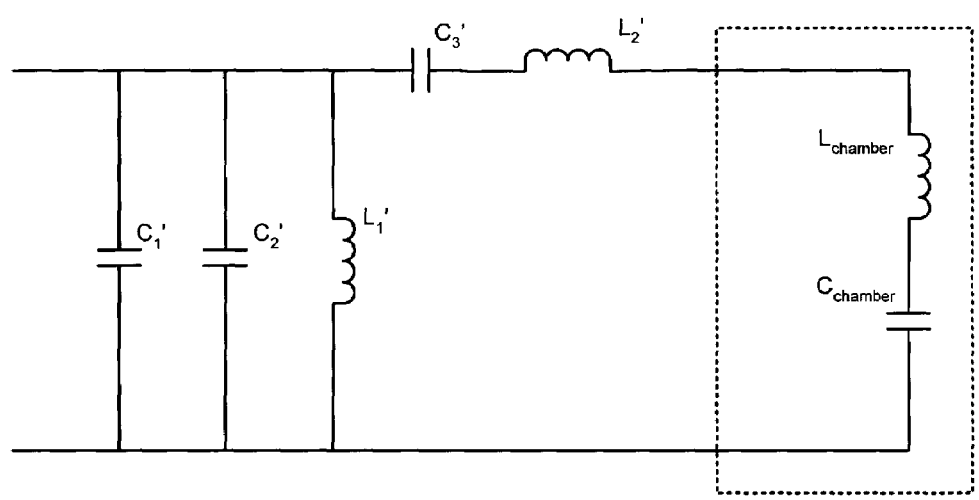

According to embodiments of the invention, the bias rf generator 131C has an operational frequency below 5 MHz. The frequency may conveniently be chosen to be approximately 3 MHz, which avoids interference with the approximately 2-MHz frequencies of the source rf generators 131A and 131B. Furthermore, the rf generator 131C may be provided as a frequency-sweeping generator configured to sweep through a range of frequencies around the nominal operational frequency. Such frequency sweeping is used to optimize impedance matching, both initially and in response to power changes in the plasma. For example, the frequency may vary periodically to seek a minimum reflected power, at which point the frequency may stabilize until the impedance changes in response to a change in plasma conditions. The period of the variation may be about 50-100 ms, with the resulting time to complete the tuning being on the order of 1 second, which compares favorably with alternative motor-driven impedance-matching techniques that take about 5-10 seconds to complete the tuning. Such a tuning mechanism is also generally more reliable than motor-driven matching mechanisms and reduces device damage caused by nonuniform plasma distribution in the initiation stage. Examples of electrical structures that may be used for the matching networks are provided in FIGS. 3A and 3B, with the dashed lines surrounding a circuit equivalent to the process chamber. FIG. 3A corresponds to a so-called "T-type network" and FIG. 3B corresponds to a so-called "L-type network." Suitable values for the capacitive and inductive elements in each of the networks is provided in Table I.

TABLE I

Matching-network Parameters

| Component | Value |
| --- | --- |
| T-Type Network | |
| $C_1$ (pF) | 10-650 |
| $C_2$ (pF) | 10-650 |
| $C_{self}$ (pF) | ~10 |
| $L_1$ (μH) | 5-10 |
| L-Type Network | |
| $C_1'$ (pF) | ~1300 |
| $C_2'$ (pF) | 10-6500 |
| $C_3'$ (pF) | 20-900 |

TABLE I-continued

Matching-network Parameters

| Component | Value |
|---|---|
| $L_1'$ (μH) | 0.1-1.0 |
| $L_2'$ (μH) | 3.0-8.0 |

Figure 4:
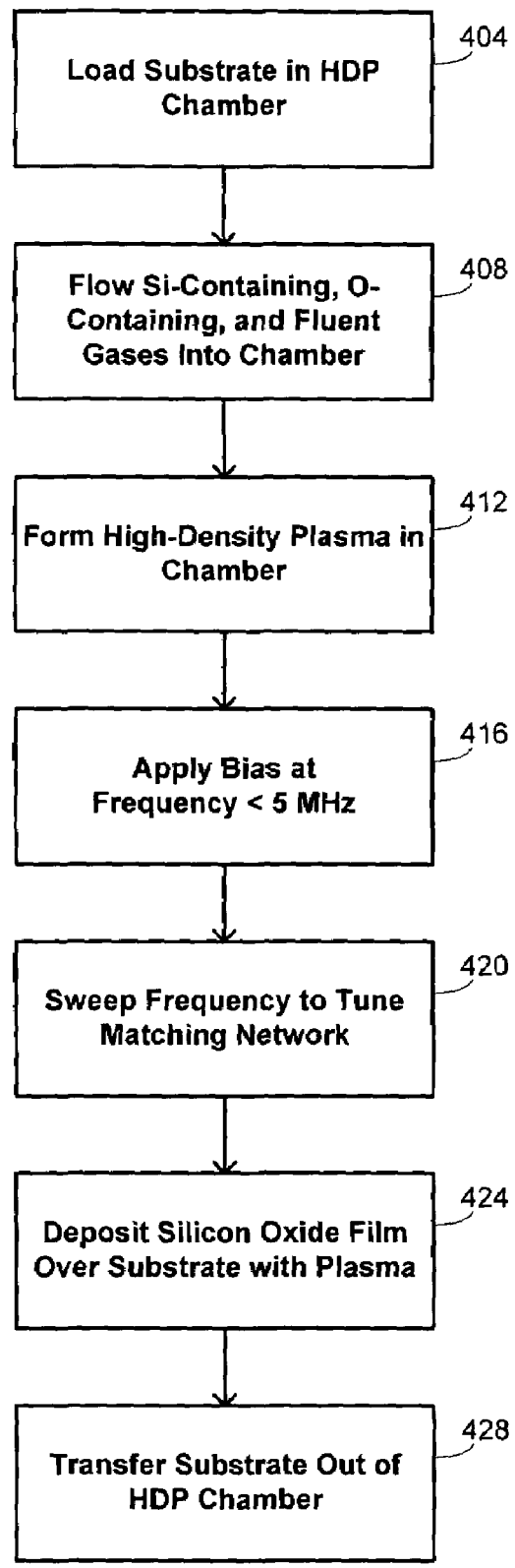
FIG. 4 provides a flow diagram illustrating a method for depositing a film in accordance with an embodiment of the invention.

The HDP substrate processing system may advantageously be used for deposition of films, particularly under conditions of low pressure and/or high bias power, such as may be suitable for aggressive gapfill applications. An overview of a deposition process that may be performed in embodiments of the invention is thus provided with the flow diagram of FIG. 4. At block 404, a substrate, such as a 200-mm-diameter or a 300-mm-diameter silicon wafer, is loaded in an HDP chamber. To deposit a silicon oxide over the substrate, a silicon-containing gas, an oxygen-containing gas, and a fluent gas are flowed into the chamber at block 408. The silicon-containing gas may comprise a silane such as monosilane $SiH_4$. The oxygen-containing gas may comprise molecular oxygen $O_2$. The fluent gas may be provided with a flow of $H_2$ or with a flow of an inert gas, including a flow of He, Ne, or Ar. The level of sputtering provided by the different fluent gases is generally inversely related to their atomic mass (or molecular mass in the case of $H_2$), with $H_2$ producing even less sputtering than He. In some instances, the fluent gas comprises two or more such gases. Dopants may be added to the film by also including a precursor gas with the desired dopant, such as by including a flow of $SiF_4$ to fluorinate the film, including a flow of $PH_3$ to phosphorate the film, including a flow of $B_2H_6$ to boronate the film, including a flow of $N_2$ to nitrogenate the film, and the like.

A high-density plasma is formed in the chamber at block 412 from the precursor gases, the plasma having a density of at least $10^{11}$ ions/cm$^3$. A bias is applied to the substrate at block 416 with a nominal frequency less than 5 MHz. In one embodiment, the nominal frequency is approximately 3 MHz. The impedance matching network may be tuned by sweeping the frequency electrically about the nominal frequency at block 420. Under such conditions, the silicon oxide film is deposited over the substrate at block 424. Consistent with the description provided above, the chamber pressure may be less than 2 mtorr or may be less than 1 mtorr in some embodiments, as enabled by the low-frequency bias generation. Further, the bias power may be greater than 3000 W, may be greater than 5000 W, or may be greater than 7500 W in different embodiments, as enabled by the low-frequency bias generation. In fact, it has been shown both from theory and from experiments that lower-frequency RF power has more efficiency, i.e. that less power can achieve the same bias. After deposition of the film is completed, the substrate is transferred out of the HDP chamber at block 428.

In some embodiments, the substrate over which the film is deposited includes adjacent raised features that define gaps to be filled with the film. In gapfill applications, the method described in connection with FIG. 4 makes use of redeposition effects to fill gaps without the formation of voids. Such a redeposition mechanism is illustrated with FIGS. 5A-5C, which are simplified cross-sectional views of a silicon oxide film at different stages of deposition. The sequence of these drawings demonstrates how the gapfill limits of conventional HDP-CVD processing may be reached for certain small-width gaps having relatively large aspect ratios. For purposes of illustration, the gapfill problem illustrated in this sequence of drawings has been exaggerated.

FIG. 5A shows the initial stages of film deposition over a substrate having a gap 510 defined by two adjacent features 512 and 514 formed over the substrate. The conventional HDP-CVD silicon oxide deposition process results in direct silicon oxide deposition on the horizontal surface 516 at the bottom of the gap 510, and on horizontal surfaces 518 above the features 512 and 514. The process also results in indirect deposition, referred to herein as "redeposition," of silicon oxide material on the sidewalls 520 as a result of recombination of material sputtered from the silicon oxide film as it grows. In certain small-width high-aspect-ratio applications, limitations on process parameters chosen to avoid bias discharge may cause continued growth of the silicon oxide film that result in formations 522 on the upper section of the sidewall 520. These formations may grow towards each other at a rate of growth exceeding the rate at which the film grows laterally on lower portions 524 of the sidewalls, as illustrated for an intermediate time in FIG. 5B. The final result of this process is shown in FIG. 5C, in which a void has been formed within the deposited material because the formations 522 have grown together. By increasing the range of process parameters over which the deposition may occur in accordance with embodiments of the invention, excess growth of the film on upper sidewall sections may be avoided to improve the bottom-up gapfill characteristics of the process.

The specific gapfill characteristics for production of a given integrated circuit may differ. For example, FIG. 6 provides an illustration of an integrated circuit 600 that has areas 604 of densely packed active devices where transistors are formed, and areas 608 where the active devices are relatively isolated. These isolated areas 608 are sometimes referred to in the art as "open areas," and may have devices that are separated by distances more than an order of magnitude or more than the spacing between devices in the densely packed active are 604. Sidewall deposition has been found to occur at a significantly higher rate on gaps formed in the densely packed portion of the integrated circuit 600 than on gaps formed in the open areas 608. The wider range of available process parameters enabled by embodiments of the invention are thus especially suitable for deposition in densely packed areas.

Those of ordinary skill in the art will realize that specific parameters can vary for different processing chambers and different processing conditions, without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A substrate processing system comprising:
a housing defining a process chamber;
a substrate holder disposed within the process chamber and configured to support a substrate during substrate processing;
a gas-delivery system configured to introduce a gas into the process chamber;
a pressure-control system for maintaining a selected pressure within the process chamber;
a high-density plasma generating system operatively coupled with the process chamber for forming a plasma having a density greater than $10^{11}$ ions/cm$^3$ within the process chamber;
a radio-frequency bias system electrically coupled with the substrate holder to generate an electrical bias on the substrate at a frequency less than 5 MHz, wherein the radio-frequency bias system comprises a radio-frequency generator electrically coupled with an impedance matching network; and a controller for controlling the gas-delivery system, the pressure-control system, the high-density plasma generating system, and the radio-frequency bias system, the controller having instructions to operate the radio-frequency generator to electronically sweep through a frequency range to determine the frequency that minimizes a power reflected from the process chamber.

2. The substrate processing system recited in claim 1 wherein the radio-frequency bias system generates an electrical bias at a frequency less that 3 MHz.

3. The substrate processing system recited in claim 1 wherein the pressure-control system maintains the selected pressure less than 2 mtorr.

4. The substrate processing system recited in claim 1 wherein the pressure-control system maintains the selected pressure less than 1 mtorr.

5. The substrate processing system recited in claim 1 wherein the radio-frequency bias system generates a bias having a power greater than 5000 W.

6. The substrate processing system recited in claim 1 wherein the radio-frequency generator is adapted to change the frequency in response to a change in the power reflected from the process chamber.

7. The substrate processing system recited in claim 1 wherein the radio-frequency generator is adapted to electronically sweep with a period substantially between 50 and 100 ms.

8. A substrate processing system comprising:

a housing defining a process chamber;

a substrate holder disposed within the process chamber and configured to support a substrate during substrate processing;

a gas-delivery system configured to introduce a gas into the process chamber;

a pressure-control system for maintaining a selected pressure within the process chamber;

a high-density plasma generating system operatively coupled with the process chamber for forming a plasma having a density greater than $10^{11}$ ions/cm$^3$ within the process chamber;

a radio-frequency bias system electrically coupled with the substrate holder, the radio-frequency bias system comprising a radio-frequency generator electrically coupled with an impedance matching network; and a controller for controlling the gas-delivery system, the pressure-control system, the high-density plasma generating system, and the radio-frequency bias system, the controller having instructions to operate the radio-frequency generator to electronically sweep through a frequency range to determine the frequency that minimizes a power reflected from the process chamber.

9. The system recited in claim 7 wherein the radio-frequency generator is adapted to electronically sweep with a period substantially between 50 and 100 ms.

10. The system recited in claim 7 wherein the frequency is less than 5 MHz.

11. The system recited in claim 7 wherein the frequency range is approximately 2.7 MHz-3.3 MHz.

12. The system recited in claim 7 wherein the radio-frequency bias system generates a bias having a power greater than 5000 W.

13. The system recited in claim 7 wherein the pressure-control system maintains the selected pressure less than 2 mtorr.

14. The system recited in claim 7 wherein the pressure-control system maintains the selected pressure less than 1 mtorr.

* * * * *